United States Patent
Gao et al.

(10) Patent No.: US 9,318,509 B2
(45) Date of Patent: Apr. 19, 2016

(54) ARRAY SUBSTRATE AND METHOD FOR MANUFACTURING THE SAME, DISPLAY PANEL

(71) Applicants: BOE Technology Group Co., Ltd., Beijing (CN); Chengdu BOE Optoelectronics Technology Co., Ltd., Chengdu (CN)

(72) Inventors: Shan Gao, Beijing (CN); Yingying Nan, Beijing (CN); Young Yik Ko, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 14/337,476

(22) Filed: Jul. 22, 2014

(65) Prior Publication Data
US 2015/0270286 A1    Sep. 24, 2015

(30) Foreign Application Priority Data
Mar. 24, 2014    (CN) .......................... 2014 1 0112044

(51) Int. Cl.
*H01L 31/036*    (2006.01)
*H01L 27/12*    (2006.01)
*H01L 29/786*    (2006.01)

(52) U.S. Cl.
CPC ........ *H01L 27/124* (2013.01); *H01L 29/78633* (2013.01)

(58) Field of Classification Search
CPC .. H01L 27/124; H01L 27/127; H01L 27/1262
USPC .................................... 257/40, 43, 89, 98, 99
See application file for complete search history.

(56) References Cited

U.S. PATENT DOCUMENTS

| | | | | |
|---|---|---|---|---|
| 7,122,836 | B2 * | 10/2006 | Yamasaki | ......... G02F 1/136213 257/59 |
| 2001/0038485 | A1 * | 11/2001 | Hirabayashi | ...... G02F 1/136209 359/245 |
| 2005/0174520 | A1 * | 8/2005 | Tomihari | .......... G02F 1/136209 349/139 |

(Continued)

FOREIGN PATENT DOCUMENTS

| | | |
|---|---|---|
| CN | 102023435 A | 4/2011 |
| CN | 202196781 U | 4/2012 |

(Continued)

OTHER PUBLICATIONS

First Office Action, including Search Report, for Chinese Patent Application No. 201410112044.3, dated Jan. 5, 2016, 11 pages.

*Primary Examiner* — Dung Le
(74) *Attorney, Agent, or Firm* — Westerman, Champlin & Koehler, P.A.

(57) ABSTRACT

The present invention discloses an array substrate comprising: a first substrate on which a thin film transistor and a data line are formed; and a shield metal layer comprising a first shield metal zone positioned at a location corresponding to a channel of the thin film transistor and a second shield metal zone positioned at a location corresponding to the data line. The present invention also discloses a display panel and a method for manufacturing the array substrate. The shield metal layer formed at the location on the array substrate corresponding to the data line, there is no any black matrix region between a color filter units along a direction corresponding to the data line. The display panel comprising the array substrate has increased aperture ratio of pixel, and difficulty of manufacturing the display panel is decreased.

19 Claims, 4 Drawing Sheets

(56) References Cited

U.S. PATENT DOCUMENTS

2008/0225192 A1* 9/2008 Cheng .............. G02F 1/136209
                                                        349/39
2014/0239270 A1* 8/2014 Ko ..................... H01L 27/1255
                                                        257/40

FOREIGN PATENT DOCUMENTS

| CN | 103472646 A | 12/2013 |
| CN | 203839380 U | 9/2014 |
| KR | 10-2005-0105591 A | 11/2005 |
| TW | 200416429 A | 9/2004 |

* cited by examiner

ARRAY SUBSTRATE AND METHOD FOR MANUFACTURING THE SAME, DISPLAY PANEL

CROSS-REFERENCE TO RELATED APPLICATION

This application claims the benefit of Chinese Patent Application No. 201410112044.3 filed on Mar. 24, 2014 in the State Intellectual Property Office of China, the whole disclosure of which is incorporated herein by reference.

BACKGROUND OF THE INVENTION

1. Field of the Invention

Embodiments of the present invention relates to a display technology field, more particularly, relates to an array substrate, a method for manufacturing the array substrate, a display panel and a method for manufacturing the display panel.

2. Description of the Related Art

Since a low temperature poly-silicon (LTPS) display device has many advantages, such as, high carrier mobility, high resolution, high integration, etc., the LTPS display device becomes a main technology trend in display field. On the same one substrate, the number of color filter units increases as pixel size decreases. That is, the resolution becomes higher as the pixel size becomes smaller. Because the LTPS display device can achieve the high resolution, a display apparatus having the LTPS display device has a very small pixel size. In order to manufacture the display apparatus with the high resolution, it is necessary to reduce the size of black matrix (BM) in the LTPS display device. Accordingly, in the prior art, manufacturing process of a color filter substrate requires high precision, and assembling process of the color filter substrate and an array substrate also requires high precision. In the prior art, even if very small deviation is occurred during manufacturing the color filter substrate or assembling the color filter substrate and the array substrate, it may greatly decrease aperture ratio of pixel, increase power consumption, and deteriorate display quality of the display apparatus.

FIG. 1 is an illustrative local view of a LTPS array substrate in the prior art. A process of manufacturing the LTPS array substrate shown in FIG. 1 mainly comprises steps of: forming a shield metal (SM) layer 5 on a substrate in a zone corresponding to a channel of a thin film transistor; and forming a buffer layer, a polycrystalline silicon layer 1, a gate insulation layer, a gate line 2, a first insulation layer, a data line 3, an organic resin layer, a common electrode layer, a second insulation layer and a pixel electrode in this order on the substrate on which the SM layer 5 is formed. The SM layer 5 is formed to block the channel of the thin film transistor, so as to prevent a light leakage current from being generated. In the prior art, the SM layer 5 of the array substrate can block only the channel of the thin film transistor, and a zone between adjacent color filter units is blocked by the BM. As shown in FIG. 1, a zone on the array substrate corresponding to the color filter unit of the color filter substrate is referred as a first corresponding zone 6, and a zone on the array substrate corresponding to the black matrix of the color filter substrate is referred as a second corresponding zone 7. In order to satisfy the requirement of high aperture ratio of pixel, in the prior art, it is necessary to narrow the width of the black matrix between adjacent color filter units as possible. Thereby, the manufacturing process of the color filter substrate requires high precision, increasing the difficulty of manufacturing the color filter substrate. Furthermore, as the width of the black matrix becomes smaller, assembling process of the color filter substrate and the array substrate requires higher precision, increasing the difficulty of assembling the color filter substrate and the array substrate at the later stage.

SUMMARY OF THE INVENTION

The present invention has been made to overcome or alleviate at least one aspect of the above mentioned disadvantages.

According to an object of the present invention, there is provided an array substrate that can increase an aperture ratio of pixel of a display panel and decrease difficulty of manufacturing the display panel.

According to an aspect of the present invention, there is provided an array substrate, comprising:

a first substrate on which a thin film transistor and a data line are formed; and a shield metal layer comprising a first shield metal zone positioned at a location corresponding to a channel of the thin film transistor and a second shield metal zone positioned at a location corresponding to the data line.

According to another aspect of the present invention, there is provided a display panel comprising a color filter substrate and an array substrate assembled together, wherein the array substrate is defined by the above embodiment.

According to another aspect of the present invention, there is provided a method for manufacturing an array substrate, comprising steps of:

forming a shield metal layer on a first substrate; and forming a thin film transistor and a data line above the shield metal layer, wherein the shield metal layer comprises a first shield metal zone positioned at a location corresponding to a channel of the thin film transistor and a second shield metal zone positioned at a location corresponding to the data line.

BRIEF DESCRIPTION OF THE DRAWINGS

The above and other features of the present invention will become more apparent by describing in detail exemplary embodiments thereof with reference to the accompanying drawings, in which.

REFERENCE LIST

Figure 1:
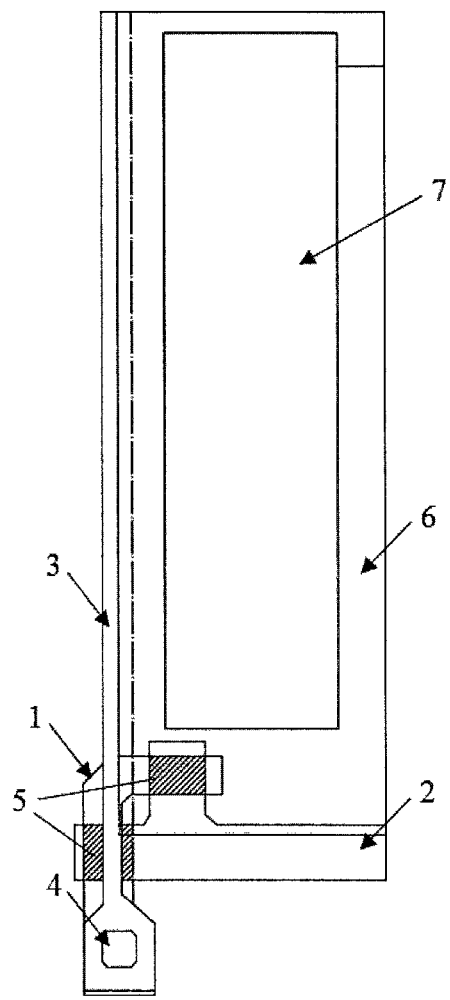
FIG. 1 is an illustrative local view of a LTPS array substrate in the prior art.

1—polycrystalline silicon layer; 2—gate line; 3—data line; 4—via;
5—shield metal layer; 51—first shield metal zone;
52—second shield metal zone; 6—first corresponding zone;
7—second corresponding zone; 8—buffer layer;

9—gate insulation layer; 10—black matrix; 11—color filter unit.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided an array substrate comprising: a first substrate on which a thin film transistor and a data line are formed; and a shield metal layer comprising a first shield metal zone positioned at a location corresponding to a channel of the thin film transistor and a second shield metal zone positioned at a location corresponding to the data line.

Figure 2:
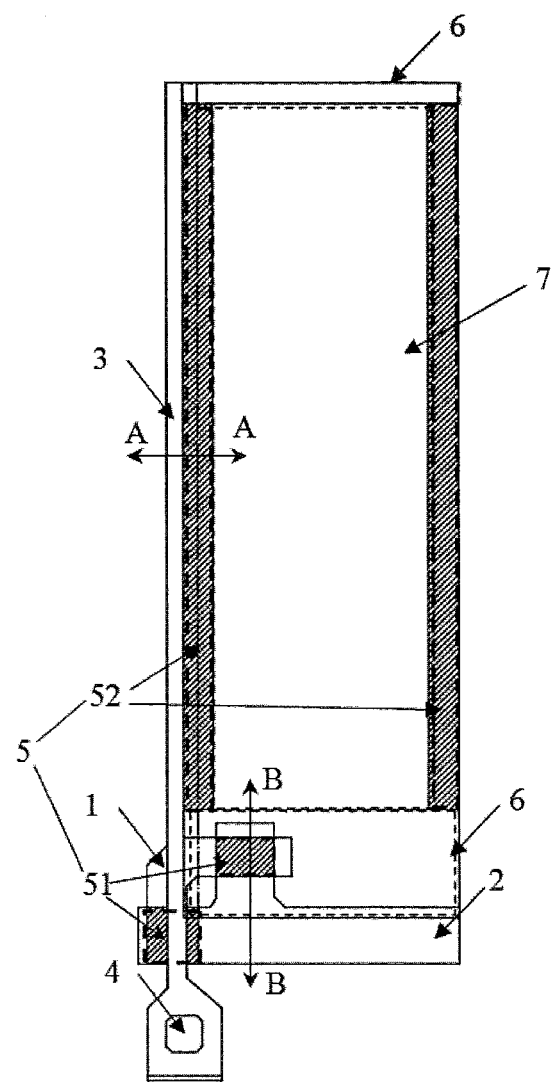
FIG. 2 is an illustrative local structure view of an array substrate according to an exemplary embodiment of the present invention.

FIG. 2 is an illustrative local structure view of an array substrate according to an exemplary embodiment of the present invention.

As shown in FIG. 2, in an exemplary embodiment of the present invention, the array substrate comprises a first substrate on which a thin film transistor (TFT), a data line 3, a gate line 2 and a shield metal layer 5 are formed. The gate line 2 is positioned at a location corresponding to a black matrix (see FIG. 5) on a color filter substrate (see FIG. 5).

Referring to FIG. 2, in the illustrated embodiment, the shield metal layer 5 comprises a zone positioned at a location corresponding to the data line 3 and zones positioned at a location corresponding to channels of the thin film transistors. In the embodiment shown in FIG. 2, a zone positioned at a location on the array substrate corresponding to the black matrix of the color filter substrate is referred as a first corresponding zone 6, and a zone positioned at a location on the array substrate corresponding to the color filter unit of the color filter substrate is referred as a second corresponding zone 7.

In an exemplary embodiment of the present invention, as shown in FIG. 2, the zones of shield metal layer 5 (a shadow region indicated by oblique lines in FIG. 2) corresponding to the channels of the thin film transistors are used to shield the channels and prevent a light leakage current from being generated. Hereinafter, the zones of shield metal layer 5 corresponding to the channels of the thin film transistors are referred as first shield metal zones 51. As for a low temperature polycrystalline silicon TFT array substrate, each pixel unit defined by gate lines and data lines on the array substrate is driven by two TFTs. Thereby, in this case, the first shield metal zones 51 shown in FIG. 2 corresponds to channels of two TFTs, respectively.

Referring to FIG. 2 again, in the illustrated embodiment, the zone of the shield metal layer 5 corresponding to the data line 3 is referred as a second shield metal zone 52, and the second shield metal zone 52 is constructed to replace the black matrix on a conventional color filter substrate corresponding to the data line. Accordingly, in the present invention, there is no any black matrix region between the color filter units along a direction corresponding to the data line, because the second shield metal zone 52 of the shield metal layer 5 formed on the array substrate is served as the black matrix region between the color filter units corresponding to the data line.

In the prior art, the black matrix region is provided on a location of the color filter substrate corresponding to the data line. Therefore, in the prior art, if it needs to increase an aperture ratio of pixel, and it is necessary to reduce the pixel size. In this case, if increasing the number of the color filter units, and it is necessary to correspondingly decrease the size of the black matrix region corresponding to the data line. As a result, in the prior art, it is difficult to perform manufacturing and aligning operation of the black matrix with small size in this region.

Since the black matrix on the conventional color filter substrate corresponding to the data line is replaced by the second shield metal zone 52 formed on the array substrate, the array substrate according to the embodiments of the present invention may greatly reduce an alignment deviation, thereby decreasing the assembling deviation and the manufacturing difficulty. Also, the shield metal layer 5 is made of metal material, and it can be more easily manufactured as small as possible than the black matrix made of photosensitive resin material, for example, photo resist. In this way, the size of the shield metal layer 5 can be reliably and stably controlled as required, and the aperture ratio of pixel can be increased.

In order to prevent the light leakage and increase the pixel size, in an exemplary embodiment of the present invention, the second shield metal zone 52 positioned at the location corresponding to the data line has a width larger than or equal to that of the data line 3.

In an exemplary embodiment of the present invention, the array substrate may further comprise a buffer layer formed above the shield metal layer 5. The thin film transistor comprises a polycrystalline silicon layer formed above the buffer layer, and the polycrystalline silicon layer is formed with said channel.

Figure 3:
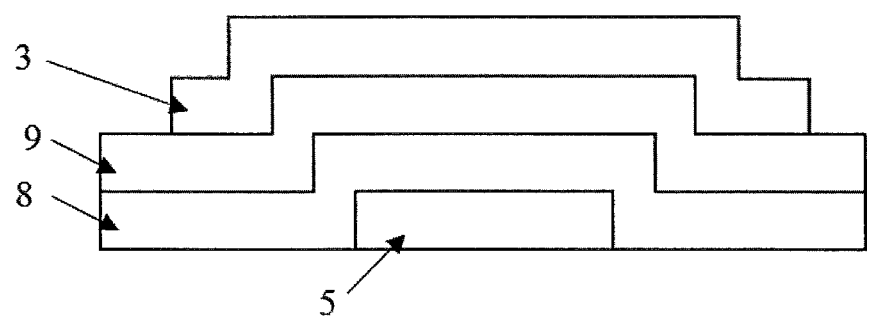
FIG. 3 is an illustrative cross section view of the array substrate of FIG. 2 taken in a line A-A.
Figure 4:
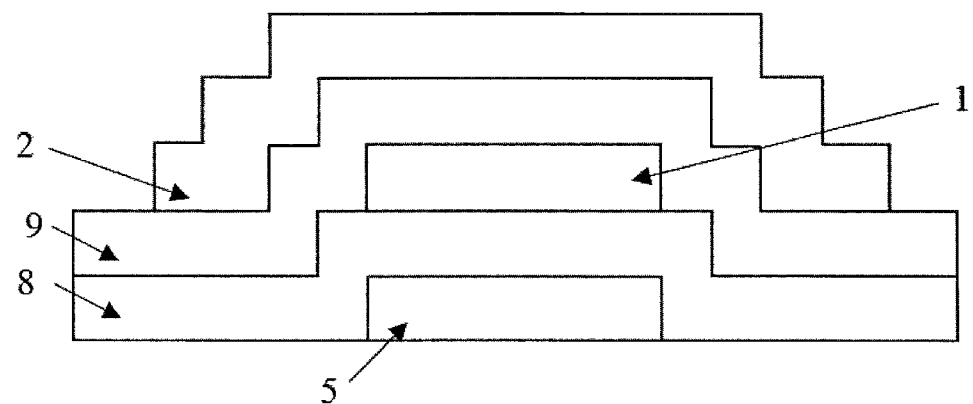
FIG. 4 is an illustrative cross section view of the array substrate of FIG. 2 taken in a line B-B.

FIG. 3 is an illustrative cross section view of the array substrate of FIG. 2 taken in a line A-A; FIG. 4 is an illustrative cross section view of the array substrate of FIG. 2 taken in a line B-B.

As shown in FIGS. 3-4, in an exemplary embodiment of the present invention, a process of manufacturing the array substrate may comprise steps of forming the buffer layer 8 above the shield metal layer 5; forming the polycrystalline silicon layer 1 above the buffer layer 8; and forming said channel in the polycrystalline silicon layer 1.

In an exemplary embodiment of the present invention, the process of manufacturing the array substrate mainly comprises steps of: forming the shield metal layer 5 on the first substrate by a patterning process; and forming the thin film transistor and the data line 3 above the shield metal layer 5. The pattern of the shield metal layer 5 is formed on a zone on the first substrate corresponding to the channel of the thin film transistor and a zone on the first substrate corresponding to the data line 3. In other words, as shown in FIG. 2, the shield metal layer 5 comprises the first shield metal zones 51 positioned at the location corresponding to the channels of the thin film transistors and the second shield metal zone 52 positioned at the location corresponding to the data line.

In an exemplary embodiment of the present invention, the step of forming the shield metal layer 5 on the first substrate comprises steps of: coating a layer of shield metal material on the first substrate; and forming the pattern of the shield metal layer 5 as required by exposing with a mask, developing and etching.

With reference to FIGS. 2-4, in an embodiment, before the step of forming the polycrystalline silicon layer 1, forming the buffer layer 8 on the first substrate on which the shield metal layer 5 formed has been formed.

In this embodiment, the shield metal layer 5 is firstly formed on the first substrate, and then the buffer layer 8 is deposited on the shield metal layer 5. Thereafter, an amorphous silicon layer is formed on the buffer layer 8, and then the amorphous silicon layer is converted into the polycrystalline silicon layer 1 by crystallizing, for example, laser annealing. Then, the pattern of the polycrystalline silicon layer 1 undergoes a doping process to adjust an initial concentration of the polycrystalline silicon layer. A part of the pattern of the polycrystalline silicon layer 1 is lightly doped to form said channel positioned at a location corresponding to the first shield metal zone 51, and the other part of the pattern of the polycrystalline silicon layer 1 except the part forming the channel is heavily doped with P-type element (trivalent element) and N-type element (pentad) to form a PMOS logic circuit as a source region and a NMOS logic circuit as a drain region, respectively. Since the polycrystalline silicon heavily doped has an electric conductivity almost equal to that of metal, it can function as a source electrode and a drain electrode. The source region of the polycrystalline silicon layer 1 passes through the gate insulation layer 9 and via 4 in the first insulation layer and is electrically connected to the data line 3, and the polycrystalline silicon at the connection to the data line 3 is heavily doped.

After the polycrystalline silicon layer 1 has been formed over the first substrate, the gate insulation layer 9 is deposited over the polycrystalline silicon layer 1, and the gate line 2 is formed over the gate insulation layer 9. The gate insulation layer 9 is used to electrically isolate the polycrystalline silicon layer 1 from the gate line 2. When a high level signal is applied on the gate line 2, the TFT is turned on. In order to electrically isolate the gate line 2 from the data line 3, a first insulation layer is deposited on the gate line 2, and the data line 3 is formed on the first insulation layer. The data line 3 is positioned at a location corresponding to a part of the shield metal layer 5. After the data line 3 has been formed, an organic resin layer is coated on the data line 3, and a patterned common electrode is formed on the organic resin layer. The common electrode may be made of indium tin oxide (ITO). The organic resin layer is used to electrically isolate the data line 3 from the common electrode, and may greatly decrease the parasitic capacitance. Finally, a second insulation layer is formed on the common electrode, and a patterned pixel electrode is formed on the second insulation layer. The pixel electrode may be electrically connected to the drain region of the polycrystalline silicon layer 1 through via. Of course, in the above embodiments, the gate insulation layer, the first insulation layer, the via, the gate line, the second insulation layer, the common electrode and the pixel electrode may be formed by conventional manufacturing processes, and their descriptions in detail are omitted herein.

According to another exemplary embodiment of the present invention, there is also provided a display panel comprising a color filter substrate and an array substrate assembled together. The array substrate may be the array substrate described according to any one of the above embodiments. The color filter substrate comprises a second substrate and a color filter layer formed on the second substrate. As shown in FIG. 2, the array substrate comprises the first substrate and the gate line 2 formed on the first substrate.

Figure 5:
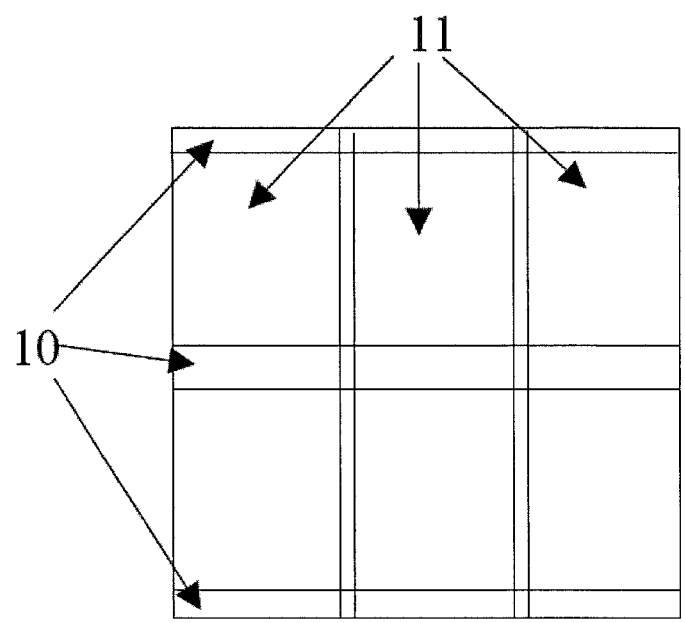
FIG. 5 is an illustrative structure view of a color filter layer of a color filter substrate according to an exemplary embodiment of the present invention.

FIG. 5 is an illustrative structure view of a color filter layer of a color filter substrate according to an exemplary embodiment of the present invention.

As shown in FIG. 5, in the illustrated embodiment, the color filter layer comprises a black matrix 10 and a plurality of color filter units 11. In an exemplary embodiment of the present invention, as shown in FIG. 5, the black matrix is only formed on a region positioned at a location corresponding to the gate line 2.

In an exemplary embodiment of the present invention, the method for manufacturing the display panel mainly comprises a step of manufacturing the above color filter substrate and the above array substrate.

In an exemplary embodiment of the present invention, the method for manufacturing the color filter substrate comprises a step of: forming a pattern of color filter layer including the color filter units and the black matrix on the second substrate by a patterning process. The black matrix is only formed on the region positioned at the location corresponding to the gate line on the array substrate.

In an exemplary embodiment of the present invention, the step of forming the color filter layer of the color filter substrate comprises steps of forming a black matrix coating layer on the second substrate; forming a plurality of apertures regions on the second substrate on which the black matrix coating layer is formed; coating a pixel resin on the second substrate; and exposing and developing the second substrate from back side by using the black matrix coating layer formed with the aperture regions as a mask, so as to form the plurality of color filter units within the plurality of aperture regions. As shown in FIG. 5, a region on the color filter unit 11 positioned at a location corresponding to the gate line on the array substrate is formed as the black matrix 10.

After the array substrate and the color filter substrate have been manufactured, they are assembled together to form the box-shaped display panel.

In the array substrate, the method for manufacturing the array substrate, the display panel and the method for manufacturing the display panel according to the above embodiments of the present invention, the shield metal layer is formed at the location on the array substrate corresponding to the data line, and the shield metal layer formed at the location on the array substrate corresponding to the data line replaces the black matrix on the conventional color filter substrate corresponding to the data line. Accordingly, in the present invention, there is no any black matrix region between the color filter units along a direction corresponding to the data line. Since the black matrix on the conventional color filter substrate corresponding to the data line is replaced by the shield metal zone formed at the location on the array substrate corresponding to the data line, the present invention may greatly reduce the alignment deviation, decrease the assembling deviation and the manufacturing difficulty. Also, the shield metal layer is made of metal material, and it can be more easily manufactured as small as possible than the black matrix made of photosensitive resin material, for example, photo resist. In this way, the size of the shield metal layer 5 can be reliably and stably controlled as required, and the aperture ratio of pixel can be increased.

In an exemplary embodiment of the present invention, the patterning process may comprise only lithographing process or comprise both lithographing process and etching process. Also, the patterning process may comprise other processes for forming a predetermined pattern, such as, printing, ink jetting, etc. The lithographing process means a patterning process, comprising a series of steps, such as, film forming, exposing and developing, for forming the predetermined pattern with the photo resist, the mask and the exposure machine. A proper patterning process may be selected based on the structure of the substrate to be formed according to an embodiment of the present invention.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An array substrate comprising:
   a first substrate on which a thin film transistor and a data line are formed; and
   a shield metal layer comprising a first shield metal zone positioned at a location corresponding to a channel of the thin film transistor and a second shield metal zone positioned at a location corresponding to the data line,
   wherein the array substrate further comprising:
      a common electrode, an insulation layer formed above the common electrode, and a pixel electrode formed above the insulation layer.

2. The array substrate according to claim 1, wherein the second shield metal zone positioned at the location corresponding to the data line has a width larger than or equal to that of the data line.

3. The array substrate according to claim 1, further comprising a buffer layer formed above the shield metal layer, wherein the thin film transistor comprises a polycrystalline silicon layer formed above the buffer layer, and the polycrystalline silicon layer is formed with said channel.

4. The array substrate according to claim 3, wherein the thin film transistor further comprises a gate insulation layer formed above the polycrystalline silicon layer and a gate line formed above the gate insulation layer.

5. The array substrate according to claim 4, further comprising another insulation layer formed above the gate line, wherein the data line is formed above the another insulation layer.

6. The array substrate according to claim 5, further comprising an organic resin layer formed above the data line, the common electrode is formed above the organic resin layer.

7. The array substrate according to claim 6, wherein the common electrode is made of indium tin oxide.

8. The array substrate according to claim 1, wherein the pixel electrode is electrically connected to a drain of the thin film transistor through a via.

9. A display panel comprising a color filter substrate and the array substrate assembled together according to claim 1, wherein the color filter and the array substrate are opposite to each other and assembled together.

10. The display panel according to claim 9,
    wherein the color filter substrate comprises a second substrate and a color filter layer formed on the second substrate;
    wherein the first substrate of the array substrate is formed with a gate line thereon; and
    wherein the color filter layer comprises a black matrix and a plurality of color filter units, and the black matrix is only formed on a region positioned at a location corresponding to the gate line.

11. A method for manufacturing the array substrate according to claim 1, comprising steps of:
    forming the shield metal layer on the first substrate; and
    forming the thin film transistor and the data line above the shield metal layer.

12. The method according to claim 11, wherein the step of forming the thin film transistor comprising:
    forming a polycrystalline silicon layer above the shield metal layer formed on the first substrate, patterning the polycrystalline silicon layer by a patterning process, and forming said channel on the patterned polycrystalline silicon layer by doping process.

13. The method according to claim 12, further comprising a step of:
    before forming the polycrystalline silicon layer, forming a buffer layer on the first substrate on which the shield metal layer has been formed.

14. The method according to claim 13, further comprising steps of:
    before forming the data line, forming a gate insulation layer on the first substrate on which the polycrystalline silicon layer has been formed; and
    forming a gate line on the gate insulation layer.

15. The method according to claim 14, further comprising a step of:
    before forming the data line, forming a first insulation layer on the first substrate on which the gate line has been formed,
    wherein the data line is formed above the first insulation layer.

16. The method according to claim 15, further comprising steps:
    forming an organic resin layer on the first substrate on which the data line has been formed; and
    forming a common electrode on the organic resin layer.

17. The method according to claim 16, wherein the common electrode is made of indium tin oxide.

18. The method according to claim 17, further comprising steps of:
    forming a second insulation layer on the first substrate on which the common electrode has been formed; and
    forming a pixel electrode on the second insulation layer.

19. The method according to claim 18,
    wherein the pixel electrode is electrically connected to a drain of the thin film transistor through a via.

* * * * *